US011376820B2

(12) United States Patent
Bureloux et al.

(10) Patent No.: US 11,376,820 B2
(45) Date of Patent: Jul. 5, 2022

(54) MANUFACTURING PROCESS FOR LAMINATED GLAZING UNIT

(71) Applicant: SAINT-GOBAIN GLASS FRANCE, Courbevoie (FR)

(72) Inventors: Dominique Bureloux, Ognes (FR); Adeline Girod, Paris (FR); Alexandre Hennion, Venette (FR); Andreas Schlarb, Wuppertal (DE); Bernd Stelling, Herzogenrath (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 736 days.

(21) Appl. No.: 16/156,537

(22) Filed: Oct. 10, 2018

(65) Prior Publication Data

US 2019/0039353 A1    Feb. 7, 2019

Related U.S. Application Data

(62) Division of application No. 14/434,602, filed as application No. PCT/FR2013/052422 on Oct. 10, 2013, now Pat. No. 10,118,369.

(30) Foreign Application Priority Data

Oct. 12, 2012   (FR) ...................................... 1259728

(51) Int. Cl.
*B32B 17/10*   (2006.01)
*B32B 3/26*     (2006.01)
(Continued)

(52) U.S. Cl.
CPC ........ *B32B 17/10376* (2013.01); *B32B 3/266* (2013.01); *B32B 17/10036* (2013.01);
(Continued)

(58) Field of Classification Search
CPC ........ B32B 17/10036; B32B 17/10293; B32B 17/10376; B32B 17/10761;
(Continued)

(56) References Cited

U.S. PATENT DOCUMENTS 3,484,584 A    12/1969   Shaw
3,866,232 A    2/1975    Weigt
(Continued)

FOREIGN PATENT DOCUMENTS

DE    70 10 329 U    7/1970
DE    72 45 210 U    4/1973
(Continued)

OTHER PUBLICATIONS

Search Report as issued in European Patent Application No. 19188149, dated Nov. 22, 2019.
(Continued)

*Primary Examiner* — A. Dexter Tugbang
(74) *Attorney, Agent, or Firm* — Pillsbury Winthrop Shaw Pittman LLP

(57) ABSTRACT

A method of fabrication of a laminated glazing unit, includes cutting out a first through-hole in a first glass sheet; positioning a conducting wire and a film of thermoplastic polymer between the first glass sheet and a second glass sheet so that a first extremity and a second extremity of the conducting wire extend outside the laminated glazing unit to be formed, and feeding out the first extremity of the conducting wire via the first through-hole so that the first extremity exits the laminated glazing unit to be formed via the first through-hole, the conducting wire extending continuously from the first extremity to the second extremity, and after the positioning and feeding out, assembling the
(Continued)

conducting wire, the film of thermoplastic polymer, the first glass sheet and the second glass sheet all together to form the laminated glazing.

29 Claims, 2 Drawing Sheets

(51) Int. Cl.
| | |
|---|---|
| *B32B 37/10* | (2006.01) |
| *B32B 37/12* | (2006.01) |
| *B32B 37/16* | (2006.01) |
| *B60J 1/00* | (2006.01) |
| *H01L 31/02* | (2006.01) |
| *H01Q 1/12* | (2006.01) |

(52) U.S. Cl.
CPC .. *B32B 17/10293* (2013.01); *B32B 17/10761* (2013.01); *B32B 37/1018* (2013.01); *B32B 37/1207* (2013.01); *B32B 37/16* (2013.01); *B32B 2307/202* (2013.01); *B32B 2307/412* (2013.01); *B32B 2398/20* (2013.01); *B32B 2605/006* (2013.01); *B60J 1/00* (2013.01); *H01L 31/02013* (2013.01); *H01Q 1/1271* (2013.01); *Y10T 29/49169* (2015.01)

(58) Field of Classification Search
CPC ........ B32B 2307/202; B32B 2307/412; B32B 2398/20; B32B 2605/006; B32B 3/266; B32B 17/1018; B32B 37/1207; B32B 37/16; H01Q 1/1271; Y10T 29/49169; H01L 31/02013; B60J 1/00
See application file for complete search history.

(56) References Cited

U.S. PATENT DOCUMENTS

| | | | |
|---|---|---|---|
| 4,894,513 A | | 1/1990 | Koontz |
| 5,850,070 A | | 12/1998 | Gillner et al. |
| 5,902,536 A | | 5/1999 | Shumaker |
| 6,043,782 A | | 3/2000 | Dishart |
| 6,075,201 A | * | 6/2000 | Wambach ......... B32B 17/10761 |
| | | | 136/251 |
| 6,838,181 B1 | | 1/2005 | Degand |
| 7,200,921 B2 | | 4/2007 | Loibl |
| 7,663,055 B2 | * | 2/2010 | Baret ................ H01L 31/02013 |
| | | | 136/251 |
| 8,427,381 B2 | | 4/2013 | Labrot |
| 8,546,729 B2 | | 10/2013 | Derda |
| 2004/0166335 A1 | * | 8/2004 | O'Regan ........... B32B 2307/412 |
| | | | 428/457 |
| 2011/0041896 A1 | * | 2/2011 | Jautard ............. H01L 31/02013 |
| | | | 136/251 |
| 2012/0103388 A1 | * | 5/2012 | Meakin ............. B32B 2307/202 |
| | | | 136/244 |
| 2012/0148798 A1 | | 6/2012 | Marguerite et al. |
| 2014/0071081 A1 | * | 3/2014 | Shedletsky ....... Y10T 29/49169 |
| | | | 345/174 |
| 2015/0283797 A1 | | 10/2015 | Hennion et al. |

FOREIGN PATENT DOCUMENTS

| | | |
|---|---|---|
| DE | 23 32 915 B1 | 5/1974 |
| EP | 1 710 104 A2 | 10/2006 |
| FR | 2 348 616 A2 | 11/1977 |
| FR | 2 996 803 A1 | 4/2014 |
| GB | 1 329 790 A | 9/1973 |
| JP | S47-016604 Y | 6/1972 |
| JP | S53-029252 U | 3/1978 |
| JP | 60152580 A * | 8/1985 |
| JP | H02-070553 A | 3/1990 |
| JP | H09-165236 A | 6/1997 |
| JP | 2003-507305 A | 2/2003 |
| JP | 2004-509827 A | 4/2004 |
| JP | 2006-523917 A | 10/2006 |
| WO | WO 02/26492 A1 | 4/2002 |
| WO | WO 2004/068643 A1 | 8/2004 |

OTHER PUBLICATIONS

International Search Report as issued in International Patent Application No. PCT/FR2013/052422, dated Dec. 16, 2013.

* cited by examiner

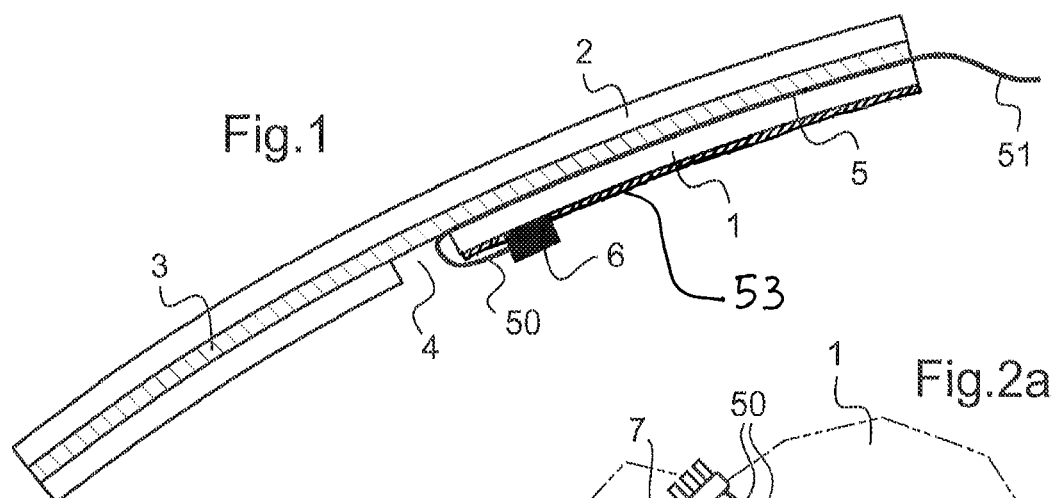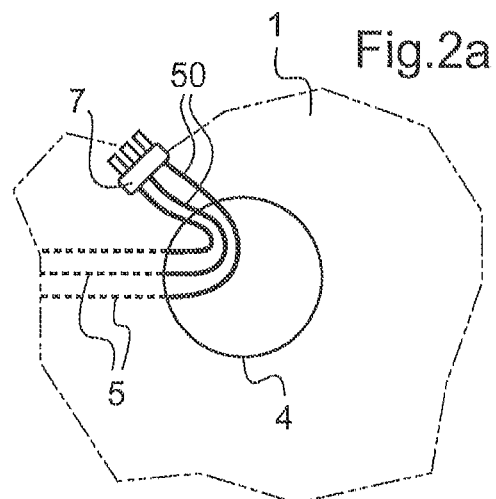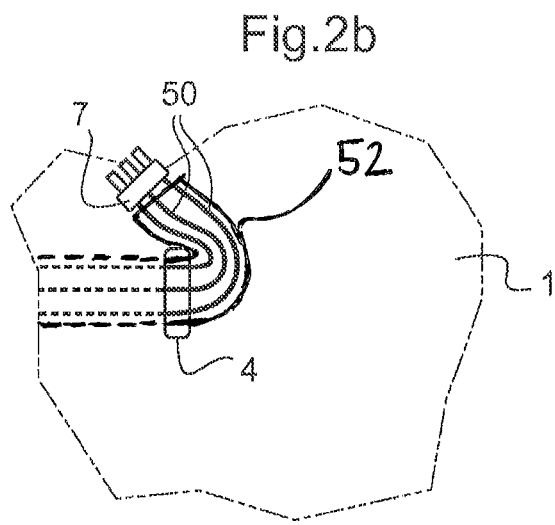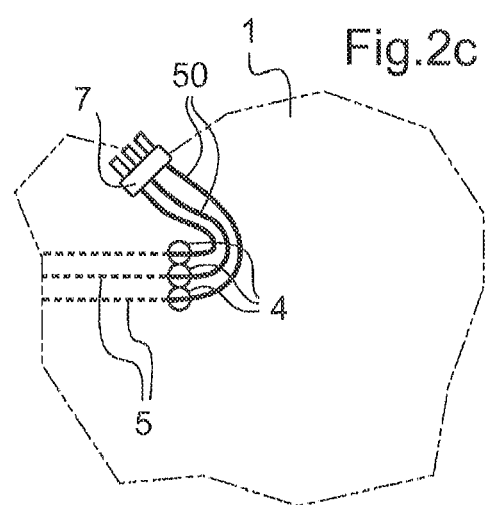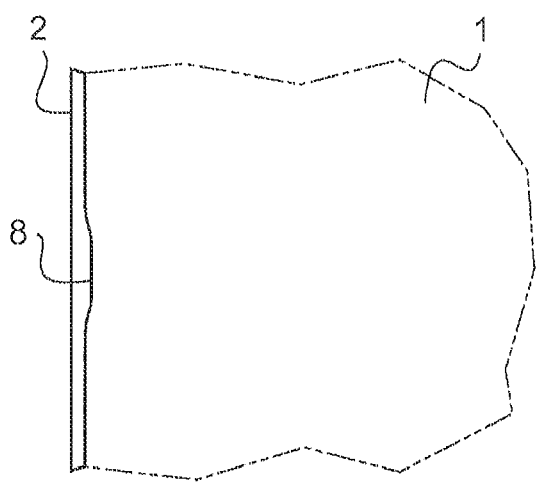

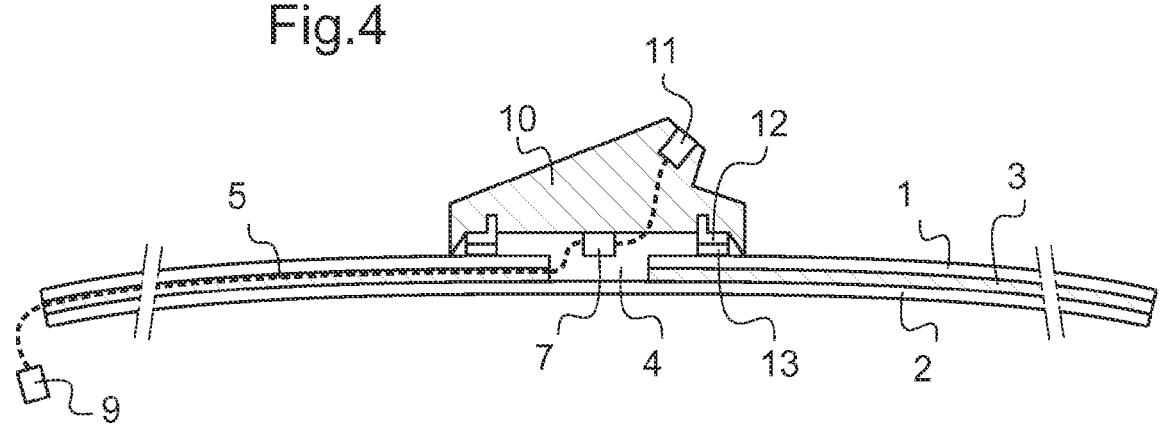
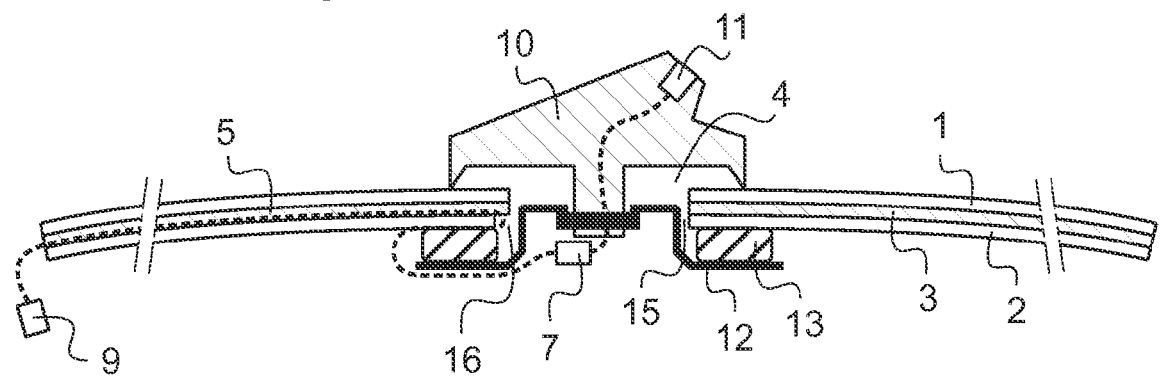

MANUFACTURING PROCESS FOR LAMINATED GLAZING UNIT

CROSS-REFERENCE TO RELATED APPLICATIONS

This application is a divisional of U.S. patent application Ser. No. 14/434,602, filed on Apr. 9, 2015, which is the U.S. National Stage of PCT/FR2013/052422, filed Oct. 10, 2013, which in turn claims priority to European Application No. 1259728, filed Oct. 12, 2012. The contents of all of these applications are incorporated herein by reference in their entirety.

The invention relates to a laminated glazing unit designed to bring conducting wires up to an accessory such as for example a camera or a rain sensor.

Known arrangements are to dispose electrical accessories such as a camera or a rain sensor on a windshield of an automobile vehicle close to the rear-view mirror. A windshield is usually composed of two glass sheets between which is inserted a spacer layer made of thermoplastic polymer. The surfaces of the glass sheets of such a laminated glazing unit are numbered from 1 to 4 starting from the external surface of the glazing unit designed to be turned toward the exterior of the vehicle and ending with the external surface of the glazing unit designed to be turned toward the interior of the vehicle.

The electrical feed for the electrical accessories, consisting of conducting wires, is generally fixed onto the face 4 of the windshield. The conducting wires are hidden from view inside of the passenger compartment by a fixed trough on the glazing unit, the trough covering the conducting wires. The conducting wires are hidden from view on the outside of the passenger compartment by a strip of black enamel deposited for example on face 2 or on face 4 of the windshield.

However, it often happens that the wires are not correctly positioned in the trough or protrude from the enamel strip. Moreover, the trough takes up space on the windshield and hides a part of the view of the driver, in particular on panoramic windshields. Furthermore, the trough can be a source of noise at certain speeds due to vibrations of the windshield.

There is therefore a need for a laminated glazing unit allowing the feed of conducting wires which guarantees a quality of positioning of the conducting wires, and which allows as wide a field of view as possible to be obtained and which overcomes the noise problem of the trough.

For this purpose, the invention provides a laminated glazing unit comprising:
  a first and a second glass sheet, the first glass sheet being equipped with a first through-hole,
  a spacer film of thermoplastic polymer disposed between the first and second glass sheets,
  at least one conducting wire buried within the spacer film or disposed between the spacer film and the first glass sheet or disposed between the spacer film and the second glass sheet, one end of each conducting wire exiting from the laminated glazing unit via the first through-hole in the first glass sheet.

According to another feature, when the conducting wire is disposed between the spacer film and the second glass sheet, the spacer film is equipped with a through-hole allowing the passage of the conducting wire through the spacer film and through the first glass sheet, the through-hole in the spacer film having a size in the range between a minimum value just allowing the passage of the conducting wire and a maximum value for which the hole substantially coincides with the first hole in the first glass sheet.

According to another feature, the second glass sheet is also equipped with a through-hole, the first through-hole in the first glass sheet and the through-hole in the second glass sheet having substantially the same size and facing one another, and the spacer film is also equipped with a through-hole coinciding with the through-holes in the first and second glass sheets.

According to another feature, the other end of each conducting wire exits from the laminated glazing unit via the end face of the laminated glazing unit or via a second through-hole in the first glass sheet situated at the edge of the glazing unit or via a through-hole in the second glass sheet situated on the edge of the glazing unit.

According to another feature, the conducting wire or wires are coated with a plastic film forming a web.

According to another feature, the conducting wires comprise a connector at at least one of their ends.

According to another feature, the first glass sheet is equipped with several first through-holes disposed near to one another.

According to another feature, the laminated glazing unit comprises several conducting wires, one end of each conducting wire exiting from the laminated glazing unit via the first through-hole or through-holes in the first glass sheet.

According to another feature, each through-hole has a size in the range between 3 and 80 mm.

According to another feature, the laminated glazing unit furthermore comprises at least one opaque enamel strip coinciding with the conducting wire or wires, hiding from view the conducting wire or wires when viewed from the exterior and/or the interior.

According to another feature, the laminated glazing unit furthermore comprises an accessory fixed onto the laminated glazing unit near to or at the first through-hole or through-holes, the accessory being connected to the end of the conducting wire or wires exiting from the laminated glazing unit via the first through-hole or through-holes in the first glass sheet.

According to another feature, the accessory is a rain or humidity sensor, a light-intensity sensor, a camera, an antenna, a lighting device, a fan or even a GPS positioning device.

According to another feature, the accessory may be fixed onto or close to the edges of the first through-hole or through-holes in the first glass sheet or accommodated inside of a through-hole in the first glass sheet and fixed onto the second glass sheet.

According to another feature, the conducting wire is a coaxial cable, preferably shielded.

The invention also relates to a method of fabrication of a laminated glazing unit such as described hereinabove, comprising:
  the supply of a first and of a second glass sheet,
  the cutting out of a first through-hole in the first glass sheet,
  where necessary, the forming of the first and second glass sheets,
  the supply of one or more conducting wires and of a film of thermoplastic polymer potentially equipped with a through-hole, and the attachment of the conducting wire or wires onto the film of thermoplastic polymer,
  the installation of the film of thermoplastic polymer carrying the conducting wire or wires between the first and second glass sheets, and the feeding out of one end of the conducting wire or wires via the first through-hole, the degassing under vacuum of the assembly, with use of a peripheral seal or of a vacuum bag together with an adhesive for blocking the through-hole or through-holes in the glass sheet or sheets or of a sucker for sucking out the air via the through-hole or through-holes in the glass sheet or sheets, the heat sealing of the edges of the laminated glazing unit and of the edges of the through-hole or through-holes, the autoclaving of the assembly.

The invention also relates to a method of fabrication of a laminated glazing unit such as described hereinabove, comprising:

the supply of a first and of a second glass sheet, the cutting out of a first through-hole in the first glass sheet, where necessary, the forming of the first and second glass sheets, the supply of one or more conducting wires coated with a transparent plastic film forming a web, and of a film of thermoplastic polymer potentially equipped with a through-hole, the installation of the film of thermoplastic polymer between the first and second glass sheets, the web of conducting wires being disposed between the film of thermoplastic polymer and the first glass sheet or the second glass sheet, and the feeding out of one end of the conducting wire or wires via the first through-hole, the degassing under vacuum of the assembly, with use of a peripheral seal or of a vacuum bag together with an adhesive for blocking the through-hole or through-holes in the glass sheet or sheets or of a sucker for sucking out the air via the through-hole or through-holes in the glass sheet or sheets, the heat sealing of the edges of the laminated glazing unit and of the edges of the through-hole or through-holes, the autoclaving of the assembly.

Other features and advantages of the invention will now be described with regard to the drawings in which:

FIG. 1 shows a cross-sectional view of a laminated glazing unit according to the invention;

FIGS. 2a, 2b, 2c are detailed views, according to three respective embodiments, of the laminated glazing unit according to the invention with several conducting wires;

FIG. 3 is a detailed view of the edge of the laminated glazing unit according to one embodiment of the invention;

FIGS. 4 and 5 are cross-sectional views, according to two respective embodiments, of a laminated glazing unit according to the invention with an antenna accessory mounted on the glazing unit.

The reference numbers which are identical over the various figures represent similar or identical elements.

Throughout the description, the term "wire" should not be understood in the limited sense. Indeed, it also covers cables.

Throughout the description, the "size" of a hole means the largest dimension of the hole, namely the diameter when the hole is circular.

The invention relates to a laminated glazing unit comprising a first and a second glass sheet, together with a spacer film of thermoplastic polymer disposed between the two glass sheets. The first glass sheet is equipped with a first through-hole. The laminated glazing unit also comprises at least one conducting wire buried within the spacer film or disposed between the spacer film and the first glass sheet or disposed between the spacer film and the second glass sheet, one end of the conducting wire exiting from the laminated glazing unit via the first through-hole in the first glass sheet.

Thus, the conducting wire or wires are disposed between the two glass sheets while being buried within the film of thermoplastic polymer or while being disposed between the film of thermoplastic polymer and one of the glass sheets, which guarantees a quality of positioning of the conducting wires and an improved facility for transport without damaging the conducting wires. Moreover, the trough is no longer needed since the conducting wires can exit from the glazing unit at the same place as the positioning of the accessory to be connected. For this reason, the field of vision is improved and there is no longer any noise generated by the trough when the vehicle is running.

FIG. 1 shows a cross-sectional view of a laminated glazing unit according to the invention.

The laminated glazing unit comprises a first glass sheet 1, a second glass sheet 2 and a spacer film 3 of thermoplastic polymer, disposed between the two glass sheets. The spacer film is for example a film of PVB, standard or with acoustical damping properties. The first glass sheet comprises a first through-hole 4. The first glass sheet 1 may just as easily be positioned on the interior side as on the exterior side of the vehicle, depending on the applications. In addition, the spacer film can comprise a through-hole coinciding with the first through-hole 4 of the first glass sheet, as shown in FIG. 4.

The laminated glazing unit also comprises at least one conducting wire 5 which is buried within the spacer film 3 or which is disposed between the spacer film 3 and the first glass sheet 1, or alternatively, which is disposed between the spacer film 3 and the second glass sheet 2. This provides it with a protection which is integrated into the laminated glazing unit. When the conducting wire 5 is disposed between the spacer film 3 and the second glass sheet 2, the spacer film 3 can be equipped with a through-hole which coincides with the first hole 4 in the first glass sheet 1, in other words which is substantially the same size and which is facing it, in order to allow the passage of the conducting wire 5 through the spacer film 3 and through the first glass sheet 1. However, preferably, when the conducting wire 5 is disposed between the spacer film 3 and the second glass sheet 2, the spacer film 3 has a through-hole which is as small as possible so as to just allow the passage of the conducting wire 5. The through-hole in the spacer film 3 may also have all the possible sizes in between these two values extremes. The maximum size of the through-hole in the spacer film is 10 mm at the most larger than the size of the through-hole in the glass sheet. In a preferred manner, when no conducting wire is fed through the spacer film, the spacer film does not comprise a through-hole, which allows the glazing unit to better withstand impacts.

The conducting wire 5 has one end 50 which is designed to be connected to an accessory 6, for example an electrical accessory, preferably via a connector (7 in FIGS. 2, 4 and 5). The other end 51 of the conducting wire 5 is designed to be connected to an electrical power supply and/or an electrical device on the vehicle, preferably via a connector (9 in FIGS. 4 and 5). One end 50 of the conducting wire 5 exits from the laminated glazing unit via the first through-hole 4. The first through-hole 4 is for example circular for facility of fabrication. It must be as small as possible to allow the laminated glazing unit to comply with the standard R43 and large enough to allow the passage of the conducting wire, or even the connector, through it. Thus, preferably, the first through-hole 4 has a size in the range between 3 and 80 mm.

The connector 7, 9 allows the end of the conducting wire 5 to be protected during transport and handling. The connector 7, 9 is preferably as compact as possible while at the same time being mechanically stable and being capable of ensuring a reliable electrical connection in a vehicle environment, in particular being resistant to the various potential detrimental effects such as vibrations, wide variations in temperature, oxidizing atmospheres, etc.

Preferably, the conducting wire or wires 5 are coated with a plastic film forming a thin and flexible web 52 (see FIG. 2b). The plastic film may be transparent (which allows a very discrete product to be obtained), black (which obviates the need to add black enamel to the glass in order to mask the conducting wires), or else colored (which may allow the esthetic appearance of the finished product to be improved, once integrated into a glazing unit). The use of such a web 52 furthermore provides a facility for handling during the assembly. The web 52 is preferably equipped with connectors at each of its ends prior to assembly of the glazing unit. In addition, in order to facilitate the assembly, the web 52 can be coated with PVB or an adhesive to allow its adhesion to the first glass sheet. Finally, the web 52 must in addition be sufficiently thin so as not to apply a permanent bending force to the glass during the assembly and so as to thus avoid damage to the glass around the edge of the hole or holes via which the web 52 exits. In order to deal with this problem, the glass preferably has pre-stressed edges around the periphery of the exit holes for the ends of the conducting wires.

The accessory 6 to which the conducting wire or wires 5 is/are designed to be connected may be fixed onto the laminated glazing unit, as shown in FIG. 1, or near to the laminated glazing unit, for example on a rear-view mirror support. The accessory 6 is for example a rain or humidity sensor, a light-intensity sensor, a camera, an antenna, a lighting device, a fan or even a GPS positioning device. The conducting wire 5 allows electrical power to be supplied to the accessory 6 and/or information produced by the accessory 6 to be linked to the electrical device of the vehicle. The conducting wire 5 is for example made of copper.

Depending on the applications, for example for the connection to a camera, the conducting wire or wires 5 may be coaxial cables, preferably shielded.

Depending on the type of accessory, one or more conducting wires 5 are needed.

FIGS. 2a, 2b, 2c show detailed views, according to three respective embodiments, of the laminated glazing unit according to the invention with several conducting wires.

In FIG. 2a, the first glass sheet 1 comprises a single first through-hole 4, of circular shape, via which the ends 50 of the conducting wires 5 designed to be connected to an accessory exit.

In FIG. 2b, the first glass sheet 1 comprises a single first through-hole 4, in the form of a slit, via which the ends 50 of the conducting wires 5 designed to be connected to an accessory exit.

In FIG. 2c, the first glass sheet 1 comprises three first through-holes 4, of circular shape, via each of which the end 50 of one conducting wire 5 designed to be connected to an accessory exits.

The circular through-holes may be formed by a bell saw. The through-holes in the form of a slit may be formed by water jet or diamond drill machining.

The end 50 of the conducting wire or wires 5 designed to be connected to the accessory 6 may be inserted into a connector 7, as shown in FIGS. 2a to 2c, which facilitates the connection to the accessory 6, in particular when the latter takes place well after the fabrication of the laminated glazing unit.

FIG. 3 is a detailed view of the edge of the laminated glazing unit according to one embodiment of the invention.

The first glass sheet 1 may comprise a second through-hole 8 on the edge of the glazing unit. The second through-hole 8 allows the other end 51 of the conducting wire 5 to exit for connection to an electrical power supply and/or an electrical device on the vehicle. This other end 51 can be inserted into a connector 9 (FIGS. 4 and 5) in order to facilitate a later connection to the vehicle. The second through-hole 8 in the first glass sheet 1 may be formed on the edge of the first glass sheet 1, for example in the form of a notch, as shown in FIG. 3, or near to the edge of the first glass sheet 1.

When the first glass sheet 1 does not comprise a second through-hole 8, the end 51 of the conducting wire 5 exits from the laminated glazing unit via the end face of the laminated glazing unit, as shown in FIG. 1.

Optionally, the laminated glazing unit furthermore comprises at least one opaque enamel strip 53 (see FIG. 1) coinciding with the conducting wire or wires, hiding from view the conducting wire or wires when viewed from the outside and/or the inside of the vehicle. However, since the conducting wires buried within the spacer film can be very thin (a few tens to a few hundreds of microns) and the width of the web is small (a few millimeters to around fifteen millimeters), the enamel strip 53 is much narrower than when a trough is used, and the enamel strip 53 is not three-dimensional like the trough, which allows the field of view and the viewing comfort to be greatly improved.

The laminated glazing unit may also comprise an accessory 6 fixed onto the laminated glazing unit. The accessory 6 can be fixed onto the edges of the first through-hole or through-holes 4 of the first glass sheet 1, for example by click-fit or by adhesive bonding, or near to the first through-hole or through-holes 4 of the first glass sheet 1, for example by adhesive bonding. As a variant, the accessory may also be accommodated inside of the through-hole 4 of the first glass sheet 1 and be fixed, for example by adhesive bonding, onto the second glass sheet 2, on face 2 or 3 of the laminated glazing unit depending on the positioning of the first and second glass sheets within the laminated glazing unit.

Furthermore, the second glass sheet may also comprise a through-hole (15, FIG. 5). In this latter case, the first through-hole 4 in the first glass sheet 1 and the through-hole 15 in the second glass sheet 2 have preferably substantially the same size and are facing each other. The spacer film is then also equipped with a through-hole which coincides with the first holes 4, 15 in the first and second glass sheets 1, 2, as shown in FIG. 5, in other words which has substantially the same size and which is facing the through-holes 4 and 15. The maximum size of the through-hole in the spacer film is at the most 10 mm larger than the size of the through-holes in the two glass sheets.

The second glass sheet 2 may also comprise a through-hole on the edge of the glazing unit, which can be formed on the edge of the second glass sheet 2, for example in the form of a notch, or near to the edge of the second glass sheet 2.

FIGS. 4 and 5 are cross-sectional views, according to two respective embodiments, of a laminated glazing unit according to the invention with an antenna accessory mounted on the glazing unit.

These figures are exemplary embodiments of a laminated glazing unit comprising an antenna.

An antenna base 10 is fixed onto the laminated glazing unit by attachment means 13, for example an adhesive, via support means 12. The antenna base 10 comprises a connector 11 to which the conducting wire 5 is connected via the connector 7.

In these embodiments, the first glass sheet 1 is turned toward the exterior of the vehicle. Water-tight sealing is provided by the attachment means 13 which entirely surrounds the through-holes.

In the embodiment of FIG. 5, the second glass sheet also comprises a through-hole 15. In FIG. 5, the through-hole 15 coincides with the first through-hole 4 and additionally comprises a notch 16 in order to facilitate the passage of the conducting wire 5.

The laminated glazing unit according to the invention may be fabricated according to the following method:
the supply of a first and of a second glass sheet 1, 2,
the cutting out of a first through-hole 4 in the first glass sheet 1,
where necessary, the forming of the first and second glass sheets 1, 2,
the supply of one or more conducting wires 5 and of a film of thermoplastic polymer 3 potentially equipped with a through-hole, and the fixing of the conducting wire or wires 5 onto the film of thermoplastic polymer 3,
the installation of the film of thermoplastic polymer 3 carrying the conducting wire or wires 5 between the first and second glass sheets 1, 2, and the feeding out of one end 50 of the conducting wire or wires 5 via the first through-hole 4,
the degassing under vacuum of the assembly, with use of a peripheral seal or of a vacuum bag together with an adhesive in order to block the through-hole or through-holes in the glass sheet or sheets or of a sucker for sucking out the air via the through-hole or through-holes in the glass sheet or sheets,
the heat sealing (90 to 120° C.) of the edges of the laminated glazing unit and of the edges of the through-hole or through-holes,
the autoclaving of the assembly.

The first and second glass sheets can be matched during the forming.

In the case of a web of conducting wire(s), the laminated glazing unit according to the invention may be fabricated according to the following method:
the supply of a first and of a second glass sheet 1, 2,
the cutting out of a first through-hole 4 in the first glass sheet 1,
where necessary, the forming of the first and second glass sheets 1, 2,
the supply of one or more conducting wires 5 coated with a plastic film forming a web, and of a film of thermoplastic polymer 3 potentially equipped with a through-hole,
the installation of the film 3 of thermoplastic polymer between the first and second glass sheets 1, 2, the web of conducting wires being disposed between the film 3 of thermoplastic polymer and the first glass sheet 1 or the second glass sheet 2, and the feeding out of one end 50 of the conducting wire or wires 5 via the first through-hole 4,
the degassing under vacuum of the assembly, with use of a peripheral seal or of a vacuum bag together with an adhesive in order to block the through-hole or through-holes in the glass sheet or sheets or of a sucker for sucking out the air via the through-hole or through-holes in the glass sheet or sheets,
the heat sealing (90 to 120° C.) of the edges of the laminated glazing unit and of the edges of the through-hole or through-holes,
the autoclaving of the assembly.

The first and second glass sheets may be matched during the forming.

The invention claimed is:

1. A method of fabrication of a laminated glazing unit, comprising:
cutting out a first through-hole in a first glass sheet;
positioning a conducting wire and a film of thermoplastic polymer between the first glass sheet and a second glass sheet so that a first extremity and a second extremity of the conducting wire extend outside the laminated glazing unit to be formed, and feeding out the first extremity of the conducting wire via the first through-hole so that the first extremity exits the laminated glazing unit to be formed via the first through-hole, the conducting wire extending continuously from the first extremity to the second extremity with said first and second extremities of the conducting wire extending outside the laminated glazing unit to be formed before laminating an assembly formed by the conducting wire, the film of thermoplastic polymer, the first glass sheet and the second glass sheet, and
after said positioning and feeding out, laminating the assembly formed by the conducting wire, the film of thermoplastic polymer, the first glass sheet and the second glass sheet all together to form the laminated glazing unit.

2. The method of claim 1, further comprising attaching the conducting wire onto the film of thermoplastic polymer before positioning the conducting wire and the film of thermoplastic polymer between the first and second glass sheets.

3. The method of claim 1, further comprising a plurality of conducting wires, each of the plurality of conducting wires extending continuously from a first extremity to a second extremity, and wherein the positioning comprises positioning the plurality of conducting wires and the film of thermoplastic polymer between the first glass sheet and the second glass sheet so that the first extremity and the second extremity of each of the plurality of conducting wires extends outside the laminated glazing unit to be formed, with the first extremity of each of the plurality of conducting wires exiting the laminated glazing unit to be formed via the first through-hole.

4. The method of claim 1, further comprising forming the first and the second glass sheets.

5. The method of claim 1, wherein the film of thermoplastic polymer is equipped with a through-hole and wherein the method further comprises feeding out the first extremity of the conducting wire via the through-hole of the film of thermoplastic polymer, before said laminating of the assembly.

6. The method of claim 1, further comprising
degassing under vacuum the assembly formed by the first and second glass sheets, the conducting wire and the positioned film of thermoplastic polymer, with use of a peripheral seal or of a vacuum bag, together with an adhesive for blocking the first through-hole in the first glass sheet, or of a sucker for sucking out air via the first through-hole in the first glass sheet, and
heat sealing edges of the laminated glazing unit and edges of the first through-hole, and autoclaving the assembly.

7. The method of claim 1, wherein the film of thermoplastic polymer is a film of PVB.

8. The method of claim 1, wherein the first through-hole has a size in the range between 3 and 80 mm.

9. The method of claim 1, further comprising forming at least one opaque enamel strip coinciding with the conducting wire on the first glass sheet to hide from view the conducting wire when viewed from a first main face of the laminated glazing unit or an opposite second main face of the laminated glazing unit, or both the first main face and the opposite second main face of the laminated glazing unit.

10. The method of claim 1, further comprising attaching an accessory near to or at the first through-hole, the accessory being connected to the first extremity of the conducting wire exiting from the laminated glazing unit via the first through-hole in the first glass sheet.

11. The method of claim 10, wherein the accessory is a rain or humidity sensor, a light-intensity sensor, a camera, an antenna, a lighting device, a fan or a GPS positioning device.

12. The method of claim 1, further comprising attaching a connector at the first extremity before said laminating of the assembly.

13. The method of claim 1, wherein the conducting wire is a coaxial cable.

14. The method of claim 13, wherein the coaxial cable is shielded.

15. The method of claim 1, wherein the second extremity of the conducting wire exits from the laminated glazing unit via an edge face of the laminated glazing unit or via a second through-hole in the first glass sheet or via a through-hole in the second glass sheet.

16. The method of claim 1, further comprising
attaching the conducting wire onto the film of thermoplastic polymer before positioning the conducting wire and the film of thermoplastic polymer between the first and second glass sheets, and
attaching a connector at the first extremity before said laminating of the assembly,
wherein the second extremity of the conducting wire exits from the laminated glazing unit via an edge face of the laminated glazing unit or via a second through-hole in the first glass sheet or via a through-hole in the second glass sheet.

17. The method of claim 16, wherein the conducting wire is part of a web including a plurality of conducting wires similar to said conducting wire.

18. A method of fabrication of a laminated glazing unit, comprising:
cutting out a first through-hole in a first glass sheet;
positioning (a) a film of thermoplastic polymer between the first glass sheet and a second glass sheet, and (b) a web of conducting wires between the film of thermoplastic polymer and the first glass sheet or the second glass sheet, so that a first extremity and a second extremity of the web of conducting wires extend outside the laminated glazing unit to be formed, and feeding out the first extremity of the web via the first through-hole so that the first extremity exits the laminated glazing unit to be formed via the first through-hole, the web of conducting wires extending continuously from the first extremity to the second extremity with said first and second extremities of the web of conducting wires extending outside the laminated glazing unit to be formed before laminating an assembly formed by the web of conducting wires, the film of thermoplastic polymer, the first glass sheet and the second glass sheet, the web of conducting wires being formed of conducting wires coated with a plastic film, and
after said positioning and feeding out, laminating the assembly formed by the web of conducting wires, the film of thermoplastic polymer, the first glass sheet and the second glass sheet all together to form the laminated glazing unit.

19. The method of claim 18, further comprising forming the first and the second glass sheets.

20. The method of claim 18, further comprising degassing under vacuum the assembly formed by the first and second glass sheets, the web of conducting wires and the positioned film of thermoplastic polymer, with use of a peripheral seal or of a vacuum bag, together with an adhesive for blocking the first through-hole in the first glass sheet, or of a sucker for sucking out air via the first through-hole in the first glass sheet, and
heat sealing edges of the laminated glazing unit and edges of the first through-hole, and autoclaving the assembly.

21. The method of claim 18, wherein the film of thermoplastic polymer is a film of PVB.

22. The method of claim 18, wherein the first through-hole has a size in the range between 3 and 80 mm.

23. The method of claim 18, further comprising forming at least one opaque enamel strip coinciding with the web of conducting wires on the first glass sheet to hide from view the web of conducting wires when viewed from a first main face of the laminated glazing unit or an opposite second main face of the laminated glazing unit, or both the first main face and the opposite second main face of the laminated glazing unit.

24. The method of claim 18, further comprising attaching an accessory near to or at the first through-hole, the accessory being connected to the first extremity of the web of conducting wires exiting from the laminated glazing unit via the first through-hole in the first glass sheet.

25. The method of claim 24, wherein the accessory is a rain or humidity sensor, a light-intensity sensor, a camera, an antenna, a lighting device, a fan or a GPS positioning device.

26. The method of claim 18, further comprising attaching a connector at the first extremity before said laminating of the assembly.

27. The method of claim 18, wherein the conducting wire is a coaxial cable.

28. The method of claim 27, wherein the coaxial cable is shielded.

29. The method of claim 18, wherein the second extremity of the web exits from the laminated glazing unit via an edge face of the laminated glazing unit or via a second through-hole in the first glass sheet or via a through-hole in the second glass sheet.

* * * * *